(12) United States Patent
Beach et al.

(10) Patent No.: US 7,208,388 B2
(45) Date of Patent: Apr. 24, 2007

(54) THIN FILM RESISTOR HEAD STRUCTURE AND METHOD FOR REDUCING HEAD RESISTIVITY VARIANCE

(75) Inventors: Eric W. Beach, Tucson, AZ (US); Philipp Steinmann, Unterschleissheim (DE)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 11/102,100

(22) Filed: Apr. 8, 2005

(65) Prior Publication Data
US 2006/0228879 A1  Oct. 12, 2006

(51) Int. Cl.
*H01L 21/20* (2006.01)

(52) U.S. Cl. .............. 438/381; 438/238; 438/692; 257/E21.004; 257/E21.003; 257/E21.23; 257/E27.947; 257/E27.071

(58) Field of Classification Search ........... 438/381, 438/238, 240, 241, 329, 330, 384, 691, 692, 438/722, 753, 785, 936
See application file for complete search history.

(56) References Cited

U.S. PATENT DOCUMENTS 5,924,198 A * 7/1999 Swanson et al. ........... 29/890.1
6,618,029 B1 * 9/2003 Ozawa ..................... 345/82
6,818,966 B2 * 11/2004 Beach et al. ............. 257/536

* cited by examiner

*Primary Examiner*—David Nhu
(74) *Attorney, Agent, or Firm*—W. James Brady, III; Frederick J. Telecky, Jr.

(57) ABSTRACT

A method of making integrated circuit thin film resistor includes forming a first dielectric layer (18B) over a substrate and providing a structure to reduce variation of head resistivity thereof by forming a dummy fill layer (9A) on the first dielectric layer, and forming a second dielectric layer (18D) over the first dummy fill layer. A thin film resistor (2) is formed on the second dielectric layer (18D). A first inter-level dielectric layer (21A) is formed on the thin film resistor and the second dielectric layer. A first metal layer (22A) is formed on the first inter-level dielectric layer and electrically contacts a portion of the thin film resistor. Preferably, the first dummy fill layer is formed as a repetitive pattern of sections such that the repetitive pattern is symmetrically aligned with respect to multiple edges of the thin-film resistor (2). Preferably, the first dummy fill layer is formed so as to extend sufficiently far beyond ends of the thin-film resistor to ensure only a negligible amount of systematic resistance error due to misalignment.

18 Claims, 3 Drawing Sheets

THIN FILM RESISTOR HEAD STRUCTURE AND METHOD FOR REDUCING HEAD RESISTIVITY VARIANCE

BACKGROUND OF THE INVENTION

The present invention relates generally to integrated circuit thin film resistors, and more particularly to a thin film resistor structure and method that provide very low variance in the head resistivity of thin film resistors.

FIG. 1 shows a plan view of a prior art thin film resistor 30, which may be composed of, for example, sichrome (SiCr), designated by reference numeral 2. FIG. 2 shows a section view of thin film resistor structure 30 of FIG. 1. Referring to FIGS. 1 and 2, thin film resistive layer 2 of resistor structure 30 has an elongated rectangular configuration of width W, including a central body portion of length L and two identical "head" sections 22A and 22B contacted by metal conductors 24A and 24B, respectively.

FIG. 2 shows an accurate section view of a portion of a prior art integrated circuit including a prior art thin film resistor structure in which a sichrome (SiCr) thin film resistor 2 formed on a layer or region 18 which includes several conventional "pre-metal" dielectric layers (not shown). The term "pre-metal dielectrics" is well-known in the integrated circuit industry, and includes different contiguous pre-metal dielectric layers having somewhat different doping, including, for example, for example one or more, boron-phosphorus "TEOS" (tetrethylorthosilicate) layers.

The pre-metal dielectric layer 18 may be, but typically is not chemically/mechanically polished (CMP) to precisely planarize the top surface thereof before a next layer is applied to the integrated circuit. Accordingly, the upper surface of dielectric layer 18 actually may be very smooth or may be quite "rough". Layer 18 is formed on a silicon layer 16, which itself may be formed on a silicon wafer substrate.

SiCr thin film resistor is 2 formed on an "interlevel dielectrics" layer or region 21 formed of several dielectric sub-layers (not shown). Thin film resistor "head" 22A may be composed of TiW (titanium—tungsten) which extends through an opening in a dielectric sub-layer of oxide region 20 to make electrical contact with the left end of SiCr resistor 2, and also makes contact with a portion 24A of a metallization layer 24A,B, typically formed of aluminum, formed on the upper surface of interlevel dielectric region 21. In a similar manner, a separate portion 24B of metallization layer 24A,B makes electrical contact to the right end or head of SiCr resistor 2. Interconnect "Metal 2" conductors 24A and 24B extend along the surface of dielectric layer 21 and are connected to electrodes of various circuit elements (not shown) such as transistors, capacitors, and resistors, and may also be connected by appropriate conductive vias to "Metal 1" conductors such as conductor 9.

FIG. 3 shows a graph of the product of $R_{TOTAL}$ and $W_{CORRECTED}$ for various resistor body lengths L. $R_{TOTAL}$ is the total resistance of a thin film resistor of a particular width, and $W_{CORRECTED}$ is equal to $W-\Delta W$, where $\Delta W$ is the error in resistor width W that occurs during the manufacturing processes. The slope of a line through measured data points 35 is equal to the sheet resistance $RS_{BODY}$ of the thin film resistor.

The equation for the resistance of resistor 30 of FIG. 1 is $$R_{TOTAL}=RS_{BODY}*[L/(W-\Delta W)]+2R_{HEAD},$$

where $RS_{BODY}$ is the sheet resistance of the body of the resistor and $R_{HEAD}$ is the head resistance of one end section or head section of the thin film resistor 30.

The head resistance $R_{HEAD}$ is given by the equation $$R_{HEAD}=[R_{HEADRSTVTY}*L_{HEAD}]/A_{HEAD},$$

where $R_{HEADRSTVTY}$ is the head resistivity, $L_{HEAD}$ is the length of the resistor head, and $A_{HEAD}$ is the area of the resistor head. $A_{HEAD}$ is equal to $L_{HEAD}*(W-\Delta W)$. The head resistivity $R_{HEADRSTVTY}$ is equal to the head resistance $R_{HEAD}$ multiplied by the corrected thin film resistor width $W-\Delta W$. From this, the following equation can be written for $R_{TOTAL}$:

$$R_{TOTAL}=RS_{BODY}*[L/(W-\Delta W)]+2*R_{HEADRSTVTY}/(W-\Delta W).$$

From this, the equation for a line through the data points 35 shown in FIG. 3 can be written as:

$$R_{TOTAL}*(W-\Delta W)=RS_{BODY}*L_{BODY}+2*R_{HEADRSTVTY}.$$

Note that there are other ways of determining the head resistivity $R_{HEADRSTVTY}$. For example, three different thin-film resistors could be used, two of the same width and two of the same length, to determine a $\Delta W$, a $\Delta L$ and a sheet resistance $RS_{BODY}$ by simultaneous solution of three equations. With three resistances being measured and the lengths L and widths W being known quantities for the three resistors, the three equations can be solved simultaneously to obtain the values of $\Delta L$, $\Delta W$ and the sheet resistance. Three such equations for three resistors R1 of length L1 and width W1, R2 of length L2 and width W2, and R3 of length L3 and width W3 are:

$$\Delta L=((R1*L3)-(R3*L1))/(R3-R1), \text{ assuming } W3=W1,$$

$$\Delta W=((R2*W2)-(R3*W3))/(R3-R2), \text{ assuming } L2=L3, \text{ and}$$

$$RS_{BODY}=R2((W2+\Delta W)/(L2+\Delta L)).$$

The head resistivity is related to the $\Delta L$ term, so if the resistance is high it is treated as if the resistor got longer. If the resistance is low is treated as if the resistor got shorter. In either case, the head resistivity is included as part of the $\Delta L$ term.

It should be appreciated that increasing the precision of the thin film resistors as much as possible requires minimizing the variance of the head resistivity. The above equation for the total resistance $R_{TOTAL}$ of resistor 2 includes terms for the two head resistivities and the length and width of the resistor body, and that the present invention focuses on minimizing/reducing the variance of the head resistivity component of the resistor.

It also should be appreciated that for very low value thin film resistors, i.e., very short thin film resistors, for example in a string DAC (digital to analog converter), where the string resistors may have low values of, for example, about 140 ohms to as much as 1000 ohms, the head resistivity may be a very large proportion of the total resistance of a particular resistor. Consequently, obtaining high accuracy in manufacture of the string DACs requires increasing the accuracy of the resistance of each resistor in the string DAC, and that requires controlling the integrated circuit manufacturing process so as to minimize the variance of the head resistivities of the thin-film string resistors.

The actual or "corrected" thin film resistor width $W-\Delta W$ is the difference between the design value W and an error amount ΔW. Typically, thin-film resistors experience a width change ΔW during manufacture which in some cases it may be very significant, and the value ΔW is the difference between the design value of W and the actual width of the resistor after it is fabricated. (Usually, after ΔW becomes known, the appropriate reticle of the mask set then is corrected by that amount ΔW so the actual width of the resistors in subsequently manufactured integrated circuits is very precisely equal to W.)

Head resistivity can be determined empirically by manufacturing a number of thin film resistors that are of the same width but all the various lengths. The ΔW is expected to be the same for all of them, so a graph can be plotted as shown in FIG. 3 and the head resistivity can be determined as the "Y intercept" of that data.

Thus, head resistivity of a thin film resistor can be accurately determined for a sufficient number of thin film resistors manufactured by a particular process and the accuracy and variance of the head resistivity for the process can be determined.

"Dummy fill" has been frequently utilized in conjunction with use of chemical/mechanical polishing (CMP) in integrated circuit chip fabrication processes. Dummy fill also has been utilized beneath an array of thin film resistors to disperse laser beam energy reflected during trimming of the thin film resistors so as to reduce optical interference of reflected laser energy with the incident laser beam to thereby improve laser trimming of the thin film resistors, as described in commonly assigned U.S. Pat. No. 6,818,966 issued Nov. 16, 2004 to Beach et al. In CMP processes, it is necessary to have an adequate density of the materials being polished to avoid localized over-polishing, referred to as "dishing", which results in a non-planar surface after the polishing. Non-planar surfaces are incompatible with many conventional integrated circuit processing steps. For example, if interconnect metallization is deposited on a non-planar surface and the resulting surface then is subjected to a CMP operation, there may be residues of undesired metallization which are not adequately removed. Such undesired metallization residues may cause electrical shorting or other problems that lower integrated circuit processing yield.

When CMP operations are performed in the vicinity of thin film resistors, the "dishing" referred to above may cause large "systematic" errors in the resistances and ratio-matching of resistances of the thin film resistors. This is because stress in the thin film resistive material, especially SiCr which is somewhat piezo-resistive, causes identical SiCr resistor segments to have slightly different resistances, due in part to the variation in piezo-resistivity. Not only is the resistance of every identical resistor or resistor segment different for different die and different wafers, the systematic error associated with the resistor segments typically varies significantly even within the same die.

For prior art integrated circuit surface planarizing processes, it was considered unacceptable to have any metal or any other abrupt integrated circuit topology features located underneath thin film resistors. This was because the prior art integrated circuit surface planarizing processes could not adequately planarize or precisely flatten such topology features well enough to avoid severe disruption of the matching and stability of the thin film resistors due to material stresses and/or discontinuities (especially in very thin layers such as SiCr which, for example, may be only about 30 Angstroms thick) and/or optical inaccuracies associated with photolithography techniques being used.

Thus, there is an unmet need for an improved, inexpensive integrated circuit thin-film resistor structure and method for reducing or eliminating inaccuracy in the resistances and ratios of resistances of thin-film resistors.

There also is an unmet need for an improved, inexpensive integrated thin-film resistor structure and method for reducing variance in the head resistivity of thin-film resistors.

SUMMARY OF THE INVENTION

It is an object of the invention to provide an improved, inexpensive integrated circuit thin-film resistor structure and method for reducing or eliminating inaccuracy in the resistances and ratios of resistances of thin-film resistors.

It is another object of the invention to provide an improved, inexpensive integrated thin-film resistor structure and method for reducing variance in the head resistivity of thin-film resistors.

Briefly described, and in accordance with one embodiment, the present invention provides a method of making integrated circuit thin film resistor structures each including a body section (2A) and a head section (2B), by forming a first dielectric layer (18B) having a planar surface (18-2) over a substrate (16) and providing a structure to reduce variation of head resistivity of the head section (2B) by forming a first dummy fill layer (9A) on the planar surface (18-2) of the first dielectric layer (18B), and forming a planar second dielectric layer (18D) over the first dummy fill layer (9A). A thin film resistor (2) is formed on the second dielectric layer (18D). A first inter-level dielectric layer (21A) is formed on the thin film resistor (2) and the second dielectric layer (18C). A first metal layer (22A,B) is formed on the first inter-level dielectric layer (21A), wherein a first portion (22A) of the first metal layer (22A,B) electrically contact's a portion of the thin film resistor (2) through a contact opening in the first inter-level dielectric layer (21A). Preferably, the first dummy fill layer (9A) is formed as a repetitive pattern of sections such that the repetitive pattern is symmetrically aligned with respect to multiple edges of the thin-film resistor (2). Preferably, the first dummy fill layer (9A) is formed so as to extend sufficiently far beyond ends of the thin-film resistor (2) to ensure that there is only a negligible amount of systematic resistance error due to misalignment error between the thin-film resistor (2) and of the first dummy fill layer (9A). In the described embodiment, a second interlevel dielectric layer (21B) is formed on the first interlevel dielectric layer (21A) and the first metal layer (22A,B), and a second metal layer (24A,B) is formed on the second interlevel dielectric layer (21B) so as to electrically couple a first portion (24A) of the second metal layer (24A,B) through a via (23A) to the first portion (22A) of the first metal layer. A dielectric cap layer (20) is formed on the second interlevel dielectric layer (21B) and the second metal layer (24A,B). Preferably, the first dummy fill layer (9A) is formed as a repetitive pattern of sections such that the repetitive pattern is symmetrically aligned in two orthogonal directions with orthogonal edges, respectively, of the thin film resistor (2).

In the described embodiment, a third dielectric layer (18C) is formed on the first dummy fill layer (9A) and chemically/mechanically polished to provide a planar surface (18-3) of the first dielectric layer (18C), and the second dielectric layer (18D) is deposited on the chemically/mechanically polished surface (18-3). The second dielectric layer (18D) is formed as a TEOS layer.

In the described embodiment, a third dielectric layer (18A) is formed on the substrate (16), the first dielectric layer (18B) is formed on the third dielectric layer (18A), and a second dummy fill layer (9B) is formed on the third dielectric layer (18A), wherein the first dummy fill layer (9A) is metal and the second dummy fill layer (9B) is polycrystalline silicon.

DETAILED DESCRIPTION OF THE PREFERRED EMBODIMENTS

The present invention is directed mainly to head resistivity aspects of the accuracy of thin film resistors. For a high-resistance thin film resistor, the accuracy of the head resistance and head resistivity may not be highly significant, but if the value of the thin film resistor is very low, for example 160 ohms, and very high precision is needed, for example in manufacture of a high-resolution string DAC, the head resistance might be 5 ohms at each end of a 160 ohm string resistor. A high variance in the head resistivity of such a low-value, high-precision string resistor would be completely unacceptable if the main objective was to make a string DAC with 14-bit or higher resolution/accuracy. The following embodiment of the invention provides a structure and method for providing/manufacturing thin film resistors with very low variance of head resistivity.

Figure 1:
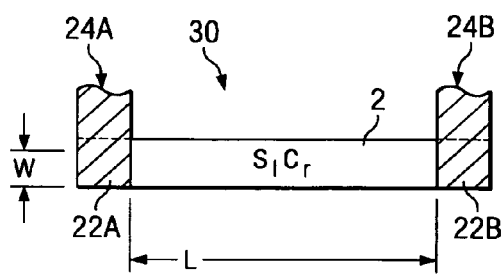
FIG. 1 is a plan view of a conventional integrated circuit thin film resistor having a "head" portion at each end and a "body" portion between the head portions.
Figure 3:
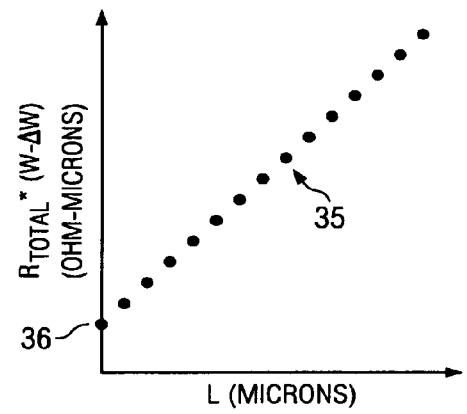
FIG. 3 is an empirical graph of the total corrected head resistivity of the thin film resistor in FIGS. 1 and 2 as a function of resistor body length L.
Figure 2:
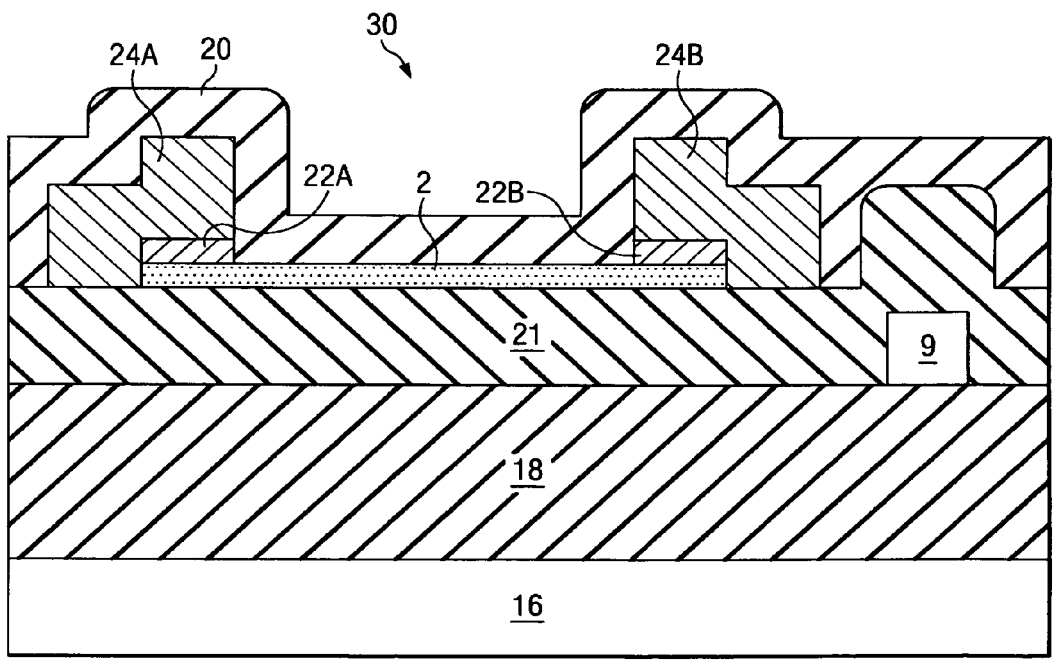
FIG. 2 is a section view of a prior art thin film resistor structure similar to that shown in FIG. 1.
Figure 4:
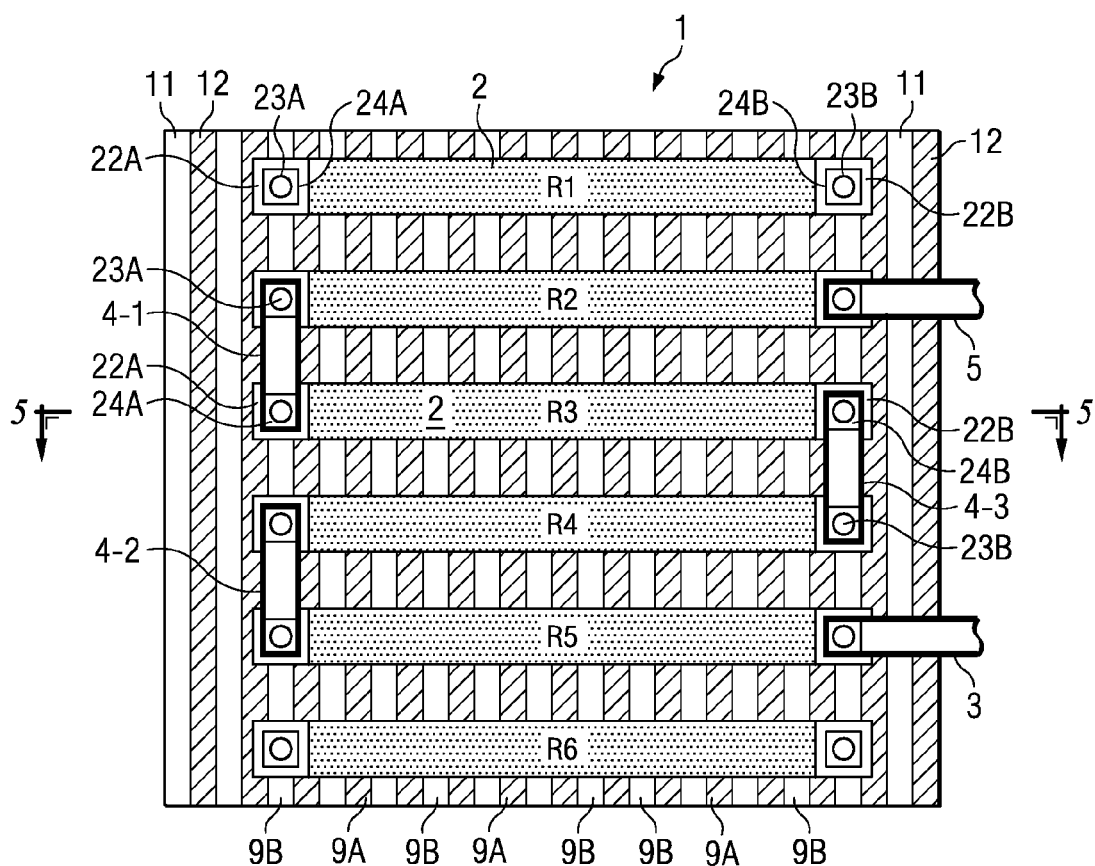
FIG. 4 is a plan view of a thin film resistor structure of the present invention including a dummy fill layer located underneath a multi-section or "composite" thin film resistor so as to provide head resistivity with low variance.

Referring to FIG. 4, an experimental integrated circuit resistor structure is shown which includes generally the same thin-film resistive element 2 and various other elements shown in prior art FIG. 2. In FIG. 4, thin-film resistor structure 1 includes elongated, rectangular resistive film segments or resistors R1, 2 . . . 6 composed of thin film material such as SiCr. The segments R1, 2 . . . 6 all are essentially identical in length, width, and spacing between the segments. A metal (typically aluminum) terminal 5 is connected through a tungsten via or plug (e.g., 23A or 23B in subsequently described FIG. 5) to a thin film resistor "head" (e.g., 22A or 22B in subsequently described FIG. 5) of thin film resistor segment R2. Thin film resistor head typically is composed of TiN (titanium-nitride). The left end of resistor segment R2 is connected in the same manner to one end of a metal connector 4-1, the other end of which is connected through a tungsten plug and a TiN head to the left end of resistor segment R3, the right end of which is connected by metal connector 4-3 to the right end of resistor segment R4. Similarly, segments R4 and R5 are connected by metal connector 4-2 in series with segments R3 and R4 and with metal terminals 3 and 5 to form a "composite" thin film resistor having a total resistance R between terminals 3 and 5. It should be noted that resistor segments R1 and R6 are "dummy" resistor segments which are provided only for the purpose of reducing/eliminating "edge effects" of segments R2 and R3 on the total resistance R. Resistor segments R1–6 also could be composed of other common thin film resistive material, such as nichrome (NiCr), alloys of SiCr or NiCr, tantalum nitride (TaN), and/or alloys of TaN.

In FIG. 4, thin-film resistor structure 1 also includes a "composite" dummy fill layer 9A,B including a polycrystalline silicon dummy fill layer 9B and a metal dummy fill layer 9A. The polycrystalline silicon dummy fill layer is composed of identical elongated, parallel, equally spaced polycrystalline silicon strips 9B which are perpendicular to the longitudinal axes of resistor segments R1–6. The metal dummy fill layer is composed of identical elongated, parallel, equally spaced metal strips 9A which are aligned with the spaces between the lower, previously formed polycrystalline silicon strips 9B. In FIG. 4 the "pitch" or periodicity of both the parallel polycrystalline silicon strips 9A and the parallel metal strips 9B is symmetric with respect to the length of resistor segments R1–6, and the length of the strips 9A and 9B is symmetric with respect to the width of the thin film resistor structure 1.

The composite dummy fill structure consisting of both the polycrystalline silicon strips 9B and the metal strips 9A extends symmetrically beyond both sides and both ends of the integrated circuit resistor structure 1. It is not really possible to achieve perfect alignment or registration of edges of the "composite" dummy fill structure 9A,9B with edges of the resistor segments R1–6, and any misalignment would inherently cause some resistivity error in the resistor segments R1–6. Therefore, it is desirable to extend the dummy fill pattern in FIG. 4 beyond the ends of resistor segments R1–6 by an amount equal, for example, to one "pitch period" (polycrystalline silicon strips 11 and metal strips 12) plus 3 standard deviations of the misalignment amount for the integrated circuit mask alignment machinery being utilized.

The use of the systematic dummy fill layers contributes to achieving the needed planarity of the various layers prior to forming another layer thereon, and also contributes to reducing and balancing of stresses in the materials, especially in the thin film resistors. It is believed at that stress of the head material 22A,B is manifested at the ends of the resistor sections, and there will be a stress gradient along the terminations, i.e., heads, of the resistor sections. The stress gradients are believed to increase at locations closer to the ends of the resistor sections.

The use of dummy resistor sections R1 and R6 (FIG. 4) on the edges helps minimize some of the stress by, in effect, moving the worst stress gradients away from the array of resistor sections. The addition of a systematic array of dummy fill metal strips under the resistor sections provides a larger, more uniform foundation for the resistor sections R1–6 to rest upon. This tends to mitigate or minimize the above mentioned stress gradients along the terminations or heads of the resistor sections. It is believed that this is because the variance in resistance caused by stress non-uniformities of the head structures is minimized or mitigated by virtue of the much greater but also much more uniform stress of and larger effect of systematic dummy fill under and extending beyond the resistor sections on the resistances of the SiCr thin film resistors.

More specifically, it is believed that the SiCr resistors are piezoresistive, and that stress gradients appear at the TiN heads, with stress vectors representing net tensile stress gradients generally directed into the body of the associated resistors (although a particular stress vector can be oriented in any direction). Because of the piezoresistivity, the stress gradients affect resistivity in the body of the SiCr resistor between the heads at the opposite ends thereof. The stress gradients also have an effect on close adjacent resistors or resistor segments. The diagram in FIG. 7 includes a portion of FIG. 4, and generally indicates typical directions of vectors 40 which represent stress and a stress gradients associated with the TiN heads such as 24A and 24B. If all of the stress forces on a particular resistor head 24A or 24B do not cancel out, there generally will be a stress gradient directed toward the head 24A or 24B. Also, there is likely to be an associated net stress gradient across the length of the SiCr resistor body 2 if the net stress gradients on each of resistor heads 24A and 24B are not equal so that their effects on resistor body 2 do not cancel. It is believed that the stresses associated with the various resistor heads, for example as shown in FIG. 4, generally are not uniform across resistors R1–6.

Figure 7:
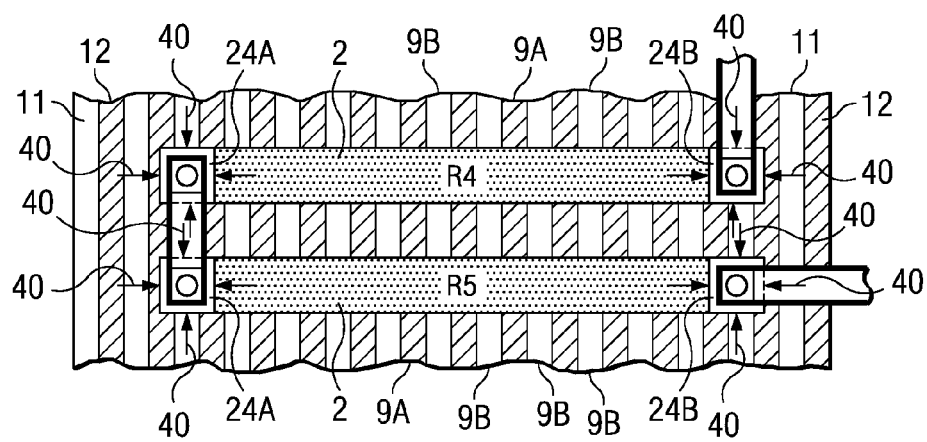
FIG. 7 is a diagram including a portion of FIG. 4 with force vectors added to aid in explaining the effect of the dummy fill in reducing the variance of the head resistivity.

It is believed that the dummy fill layer 9A,B provided underneath the thin film resistors R1–6 also has associated stresses, the magnitudes of which are much greater than any of the magnitudes indicated by stress vectors 40 in FIG. 7 and which also are much more uniform in magnitude and direction than the stresses 40 associated with the thin film resistor heads such as 24A and 24B. The relatively small stresses 40 associated with the thin film resistor heads are insignificant compared to the much larger, but also much more uniform, stresses associated with dummy fill layer 9A,B. The large, uniform stresses associated with dummy fill layer 9A,B therefore are believed to have a much greater, but also much more uniform, effect on the parameters of the piezoresistive resistor bodies 2 and the head resistivities than the much smaller, much less uniform stresses 40 associated with the thin film resistor heads 24A and 24B. It is believed that by extending the dummy fill layer 9A,B significantly beyond the ends and side edges of the heads 24A and 24B, the much larger, more uniform stresses associated with dummy layer 9A,B are caused to be located so as to completely dominate and "swamp out" the relatively negligible effects of the stresses 40 associated with the resistor heads such as 24A and 24B on the extracted (as previously described) head resistivities. Consequently, the variance in the head resistivities is greatly reduced.

The use of the systematic dummy fill layers also contributes to achieving the needed planarity of the various layers prior to forming another layer thereon, and also contributes to reducing and balancing of stresses in the materials, especially in the thin film resistors.

Figure 5:
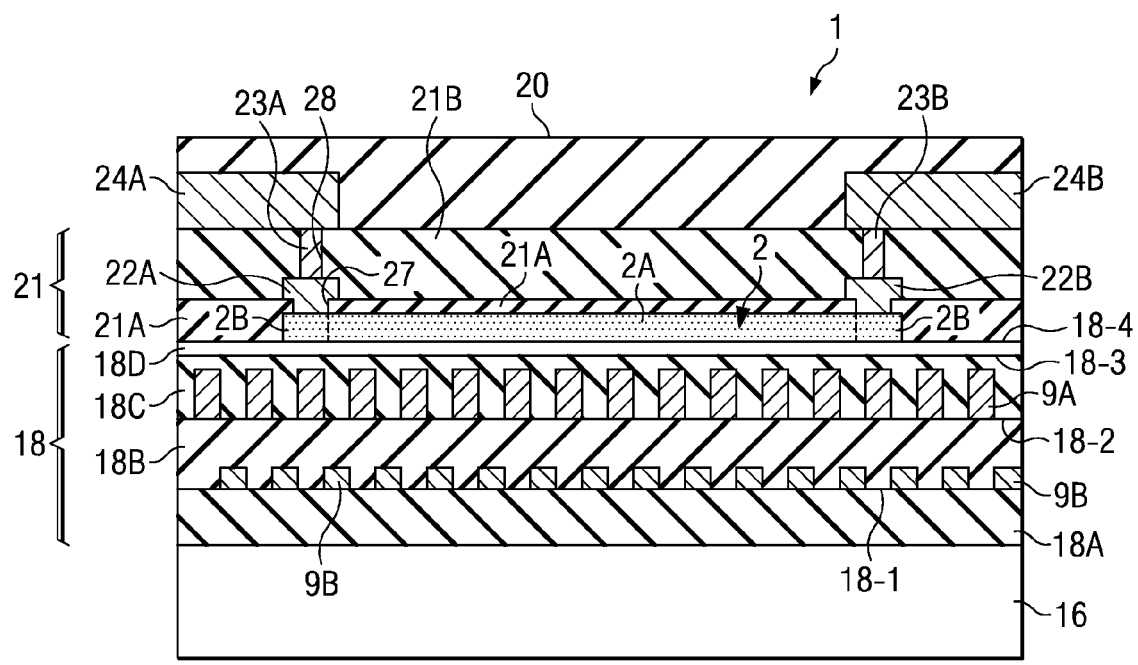
FIG. 5 is a section view along section line 5—5 of FIG. 4.

FIG. 5 shows a section view along section line 5—5 of thin film resistor structure 1 of FIG. 4. As in prior art FIG. 2, SiCr thin film resistor 2 is formed on pre-metal dielectric layer or region 18. However, in accordance with the present invention, one or more dummy fill layers, for example as shown FIG. 4, are provided within pre-metal dielectric layer or region 18.

Referring to FIG. 5, pre-metal dielectrics region 18 is formed on silicon substrate 16 (which could be an epitaxial silicon layer formed on a wafer). Region 18 includes a dielectric layer 18A formed on the upper surface of silicon layer 16. A precisely patterned layer of parallel, elongated, equally spaced, polycrystalline silicon strips 9B as shown in FIG. 4 is formed on the upper surface 18-1 of dielectric layer 18A to form a dummy fill layer 9B. The polycrystalline silicon strips 9B can be considered to be optional, but preferably are provided to provide a more uniform upper surface of pre-metal dielectrics layer 18. Another dielectric layer 18B is formed on polycrystalline silicon dummy fill layer 9B and the exposed portion of surface 18-1 of dielectric layer 18A.

A "Metal 1" layer of precisely patterned parallel, elongated, equally spaced aluminum metallization strips 9A as shown in FIG. 4 is formed on chemically/mechanically polished surface 18-2 of dielectric layer 18B to provide another dummy fill layer 9A, preferably using a HDP (high-density plasma) processes involving simultaneous depositing and etching processes to avoid "keyholes" or cracks between the narrowly spaced metal strips 9A so as to allow very uniform subsequent fill between them. A dielectric layer 18C is formed on the dummy fill layer 9A and the exposed portions of surface 18-2 of dielectric layer 18B. The upper surface 18-3 of dielectric layer 18C is planarized by a conventional CMP process. Preferably, a thin TEOS layer 18D is formed on chemically/mechanically polished surface 18-3 to provide a good non-abraded surface 18-4 on which to sputter or deposit SiCr thin film resistive material. Then SiCr resistor 2 is sputtered onto surface 18-4 in a conventional manner, and, as explained below, this is believed to result in substantially improved stability of the ratios of different resistors each composed of resistor segments such as R1–6.

The purpose of intrinsic or "clean" TEOS layer 18D is to provide un-damaged, i.e., non-abraded, oxide on which to sputter the SiCr, because chemically/mechanically polished oxide always has an abraded, and therefore chemically damaged, surface. Although the chemically/mechanically polished oxide surface is extremely smooth, at an atomic level it is damaged such that there are chemical bonds that are not "passified" or "passivated". (For example, a silicon molecule of a smooth surface can have four bonding sites, and if one of those bonding sites is "dangling" or un-passified due to mechanical damage, then as layers of silicon are being deposited as nucleation occurs at the various silicon molecule bonding sites, there will be corresponding random un-eveness in the silicon film being deposited instead of uniform, layer-by-layer deposition of the silicon. Similarly, if the SiCr is sputtered directly on an unpassivated surface, the nucleation by means of which a thin, uniform layer of SiCr can be deposited onto a high-quality oxide film that has just been deposited will be more erratic and random than is the case if the SiCr is sputtered onto a damaged, abraded oxide surface and will result in unpredictable, random resistivity variations in the SiCr thin film resistor. That will result in random variations in thickness and hence in resistivity at various sites within the thin film resistor. Stated differently, damaged or abraded oxide surface impedes smooth, continuous nucleation of thin film resistive material being deposited along the abraded oxide surface, resulting in random thick spots of reduced resistivity.)

A single, relatively wide section of metal dummy fill theoretically could be provided underneath the thin film resistor, but more uniform upper surfaces of the metal with less "peaking" and hillocking are achieved by providing spaced, narrow metal strips 9A as shown, and this may contribute to reducing the head resistivity variance by avoiding non-uniformities in subsequently formed layers that effect the head resistivity.

Still referring to FIG. 5, an interlevel dielectrics region 21 includes a dielectric layer 21A formed on SiCr resistor 2 and on the exposed area of planarized surface 18-4 of TEOS layer 18D. A conventional thin film resistor head 22A composed of TiN extends through an opening 27 in dielectric layer 21A to make reliable electrical contact with the left end of SiCr resistor 2. Another dielectric layer 21B is formed on dielectric layer 21A. Resistor head 22A also makes reliable electrical contact with the bottom of a tungsten via or plug 23A which extends to the top of interlevel dielectric layer 21 through an opening 28 therein. A portion 24A of a metallization layer 24A,B formed on the upper surface of interlevel dielectric layer 21 electrically contacts the top of tungsten plug 23A. (By way of definition, the term "layer" as used herein is intended to include a layer having multiple sections which may be, but are not necessarily, connected and/or contiguous to each other. Thus, metallization layer 24A,B includes sections 24A and 24B which are not connected to each other and are not contiguous.)

In a similar manner, a separate portion 24B of metallization layer 24A,B makes electrical contact through tungsten plug 23B and TiN thin film head 22B to the right end of TiN resistor 2. (The terminology "Metal 2" refers to a second interconnect metallization layer formed in the integrated circuit manufacturing process, wherein a first interconnect metallization layer used in the process is referred to as the "Metal 1" layer, and is used to provide electrical connection between various terminals of transistors and various passive components (not shown in FIG. 6) such as capacitors, diffused resistors, thin film resistors, etc.) An "intrinsic" or clean TEOS layer 20 is formed on metallization layer 24A,B and dielectric layer 21B.

In order to obtain a comparison of the effects of using and not using dummy fill under SiCr thin film resistors, and also to obtain a comparison of different dummy fill configurations, a single mask set was made and utilized to make integrated circuit die, each of which included the thin film resistor structures shown in FIGS. 4 and 5 both with and without the dummy fill layers 9A and 9B. The die were subjected to a temperature of greater than 150 degrees Centigrade. for approximately 4 hours during a standard packaging operation, and also were subjected to a standard "high-temperature operating life time" (HTOL time) testing procedure at 150 degrees Centigrade. for 1264 hours. Then the head resistivities of the structure of FIGS. 4 and 5 were measured and plotted as shown in FIG. 6, and the variance of the head resistivities was determined.

Figure 6:
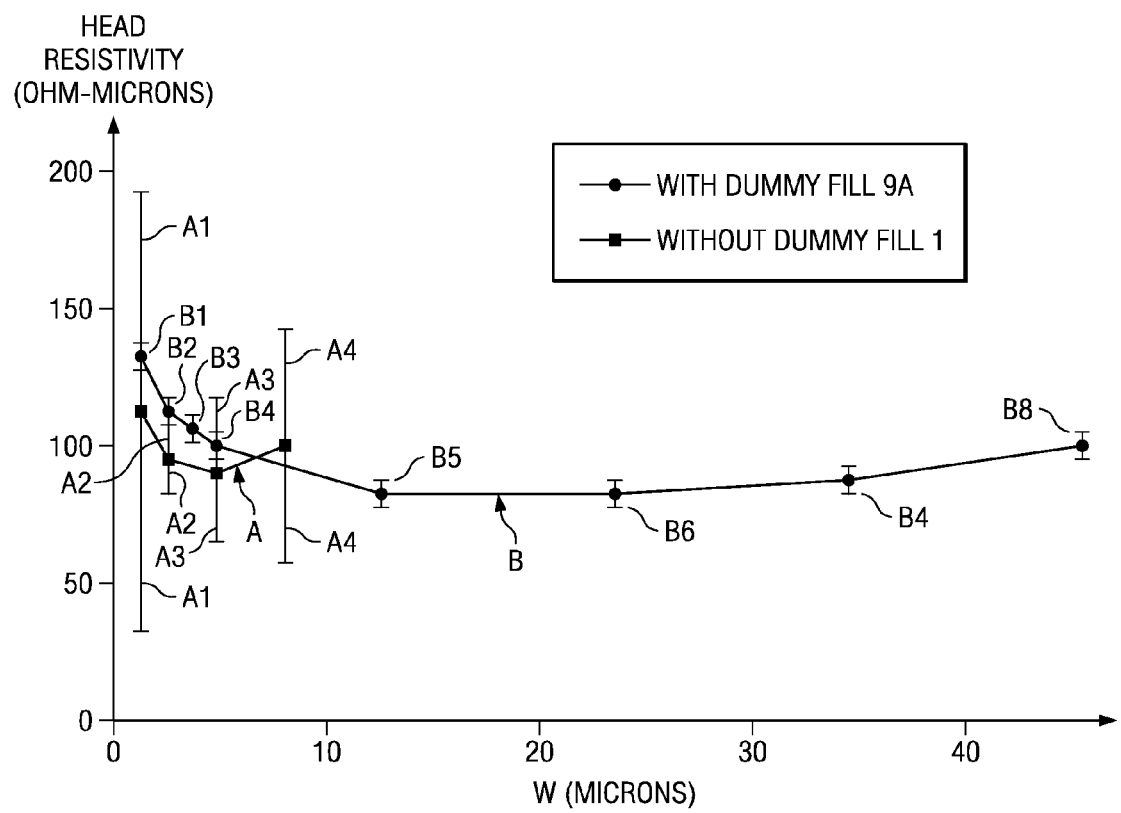
FIG. 6 is a graph showing head resistivity versus resistor width for the thin film resistor structure of FIG. 4 with and without any metal dummy fill layer.

Referring to FIG. 6, curve A shows average head resistivities and ranges of head resistivity for groups of SiCr resistors generally as shown in FIGS. 4 and 5, but without dummy fill layers such as 9A and 9B, having widths W of approximately 1, 2, 4, and 8 microns, respectively. Vertical lines A1–4 indicate the ranges (one standard deviation), and hence the variances, of head resistivities for each of the four groups, respectively. As the lengths of lines A1–4 show, the variances of the head resistivities of the SiCr resistors were very large.

However, in FIG. 6 curve B shows average head resistivities and ranges or standard deviations, and hence the variances, of head resistivity for groups of SiCr resistors generally as shown in FIGS. 4 and 5 including dummy fill layer 9A and 9B, having widths W of 1, 2, 3, 4, 12, 24, 36 and 48 microns, respectively. Vertical lines B1–8 indicate the ranges of head resistivities for each of the four groups, respectively. As the lengths of lines B1–8 show, the variances of the head resistivities of the SiCr resistors were very small compared to the SiCr resistors having no dummy fill layers under them.

It should be noted that stress errors caused by use of the symmetric dummy fill layer as shown in FIGS. 4 and 5 are "systematic" errors that result in offsets or shifts of measured voltages that are small enough be readily recognized and corrected or compensated for by circuit designers associated random errors or "spread" are small enough to allow the systematic errors to be measured/recognized. More typically, the random errors have been so large that the systematic errors or offsets have not been recognized and therefore have not been corrected for or compensated. For example, at the present state-of-the-art it has not been possible to manufacture digital to analog converters with more than approximately 12 bit accuracy without use of slow, expensive laser trimming of thin film resistors. However, use of the present invention has allowed manufacture of digital to analog converters having 16 bit accuracy without laser trimming of thin film resistors.

The data plotted in FIG. 6 indicate that providing the dummy fill layer in accordance with the present invention results in an approximately 10-fold reduction in the head resistivity variance.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, even though only integrated circuit implementations of the invention have been described in detail, those skilled in the art could readily provide a discrete thin film resistor structure in accordance with the invention.

What is claimed is:

1. A method of making integrated circuit thin film resistor structures each including a body section and a head section, the method comprising:
   (a) forming a first dielectric layer having a planar surface over a substrate;
   (b) providing a structure to reduce variation of head resistivity of the head section by
      i. forming a first dummy fill layer on the planar surface of the first dielectric layer, and
      ii. forming a planar second dielectric layer over the first dummy fill layer;
   (c) forming a thin film resistor on the planar second dielectric layer;
   (d) forming a first inter-level dielectric layer on the thin film resistor and the planar second dielectric layer; and
   (e) forming a first metal layer on the first inter-level dielectric layer, a first portion of the first metal layer extending to a portion of the thin film resistor through a contact opening in the first inter-level dielectric layer.

2. The method of claim 1 wherein step (b)(i) includes forming the first dummy fill layer as a repetitive pattern of sections, and wherein step (c) includes forming the thin film resistor such that the repetitive pattern is symmetrically aligned with respect to multiple edges of the thin film resistor.

3. The method of claim 2 wherein step (b)(i) includes forming the first dummy fill layer to extend sufficiently far beyond ends of the thin film resistor to ensure that there is only a negligible amount of systematic resistance error due to misalignment error between the thin film resistor and the first dummy fill layer.

4. The method of claim 1 including forming a second interlevel dielectric layer on the first interlevel dielectric layer and the first metal layer.

5. The method of claim 4 including forming a second metal layer on the second interlevel dielectric layer and electrically coupling a first portion of the second metal layer through a via to the first portion of the first metal layer.

6. The method of claim 5 including forming a dielectric cap layer on the second interlevel dielectric layer and the second metal layer.

7. The method of claim 1 wherein the first dummy fill layer is metal.

8. The method of claim 2 wherein step (b)(i) includes forming the first dummy fill layer as a repetitive pattern of sections such that the repetitive pattern is symmetrically aligned in two orthogonal directions with respect to orthogonal edges, respectively, of the thin film resistor.

9. The method of claim 1 including forming a third dielectric layer on the first dummy fill layer, chemically/mechanically polishing a surface of the third dielectric layer, and forming the planar second dielectric layer on the chemically/mechanically polished surface.

10. The method of claim 9 including forming the planar second dielectric layer as a TEOS layer.

11. The method of claim 1 wherein the thin film resistor is SiCr and the first metal layer is TiN.

12. The method of claim 1 including forming a third dielectric layer on the substrate, wherein step (a) includes forming the first dielectric layer on the third dielectric layer, the method including forming a second dummy fill layer on the third dielectric layer.

13. The method of claim 12 wherein the first dummy fill layer is metal and the second dummy fill layer is polycrystalline silicon.

14. The method of claim 1 wherein thin film resistor is composed of material from the group including SiCr, alloys of SiCr, NiCr, alloys of NiCr, TaN, and alloys of TaN.

15. An integrated circuit thin film resistor structure including a body section and a head section having low head resistivity variance, made by the process comprising the steps of:

(a) forming a first dielectric layer having a planar surface over a substrate;
(b) providing a structure to reduce variation of head resistivity of the head section by
  i. forming a first dummy fill layer on the planar surface of the first dielectric layer, and
  ii. forming a planar second dielectric layer over the first dummy fill layer;
(c) forming a thin film resistor on the planar second dielectric layer;
(d) forming a first inter-level dielectric layer on the thin film resistor and the planar second dielectric layer; and
(e) forming a first metal layer on the first inter-level dielectric layer, a first portion of the first metal layer electrically contacting a portion of the thin film resistor through a contact opening in the first inter-level dielectric layer.

16. The integrated circuit thin film resistor structure of claim 15 wherein the first dummy fill layer is formed as a repetitive pattern of sections, and wherein the thin film resistor is formed such that the repetitive pattern is symmetrically aligned with respect to multiple edges of the thin film resistor.

17. The integrated circuit thin film structure of claim 16 wherein step (b)(i) includes forming the first dummy fill layer as a repetitive pattern of sections such that the repetitive pattern is symmetrically aligned in two orthogonal directions with respect to orthogonal edges, respectively, of the thin film resistor.

18. The integrated circuit thin film resistor structure of claim 15 wherein the first dummy fill layer is formed to extend sufficiently far beyond ends of the thin film resistor to ensure that there is only a negligible amount of systematic resistance error due to misalignment error between the thin film resistor and of the first dummy fill layer.

* * * * *